United States Patent
Lee et al.

(10) Patent No.: US 7,759,140 B2
(45) Date of Patent: Jul. 20, 2010

(54) LIGHT-EMITTING DEVICE AND METHOD OF MANUFACTURING THE SAME

(75) Inventors: Jeong-wook Lee, Suwon-si (KR); Youn-joon Sung, Suwon-si (KR); Jae-hee Cho, Yongin-si (KR); Ho-sun Paek, Suwon-si (KR)

(73) Assignee: Samsung LED Co., Ltd., Suwon-Si, Gyeonggi-Do (KR)

(*) Notice: Subject to any disclaimer, the term of this patent is extended or adjusted under 35 U.S.C. 154(b) by 0 days.

(21) Appl. No.: 11/450,389

(22) Filed: Jun. 12, 2006

(65) Prior Publication Data
US 2006/0226431 A1    Oct. 12, 2006

Related U.S. Application Data

(62) Division of application No. 10/852,249, filed on May 25, 2004.

(30) Foreign Application Priority Data
Oct. 21, 2003    (KR) .................. 10-2003-0073442

(51) Int. Cl.
*H01L 21/00* (2006.01)
(52) U.S. Cl. ............... 438/22; 257/88; 257/98; 257/103; 257/E33.001
(58) Field of Classification Search ............ 257/79, 257/98, 103
See application file for complete search history.

(56) References Cited

U.S. PATENT DOCUMENTS

| | | | | |
|---|---|---|---|---|
| 5,181,219 A | * | 1/1993 | Mori et al. | 372/45.01 |
| 6,140,570 A | * | 10/2000 | Kariya | 136/256 |
| 6,657,236 B1 | | 12/2003 | Thibeault et al. | |
| 7,053,420 B2 | | 5/2006 | Tadatomo et al. | |
| 2002/0137249 A1 | * | 9/2002 | Ishida et al. | 438/47 |
| 2003/0057444 A1 | * | 3/2003 | Niki et al. | 257/200 |
| 2003/0197166 A1 | | 10/2003 | Ishida et al. | |
| 2004/0041164 A1 | * | 3/2004 | Thibeault et al. | 257/98 |

(Continued)

FOREIGN PATENT DOCUMENTS

JP    2002-280611    9/2002

(Continued)

OTHER PUBLICATIONS

Office Action issued in Chinese Intellectual Property Office, Application No. 200410048450.4 on Jun. 22, 2007, with English Translation.

(Continued)

*Primary Examiner*—Wai-Sing Louie
(74) *Attorney, Agent, or Firm*—Buchanan Ingersoll & Rooney PC

(57) ABSTRACT

Provided is a light-emitting device and a method of manufacturing the same. The light-emitting device includes a substrate having at least one protruded portion with a curved surface in which a consistent defect density and uniform stress distribution can be obtained even when the growth of the semiconductor crystal layer and the forming of the light-emitting device are completed. In addition, the light-emitting device has a high the light extraction efficiency for extracting light generated at an electroluminescense layer externally.

12 Claims, 8 Drawing Sheets

U.S. PATENT DOCUMENTS

2004/0048471 A1    3/2004    Okagawa et al.

FOREIGN PATENT DOCUMENTS

| JP | 2002-164296 A | 7/2009 |
| WO | 01/41225 A2 | 6/2001 |
| WO | 01/41225 A3 | 6/2001 |
| WO | 01/69663 A1 | 9/2001 |

OTHER PUBLICATIONS

Office Action issued in Chinese Intellectual Property Office, Application No. 2004-10048450.4 on Jun. 22, 2007, with English translation.

U.S. Office Action dated Jul. 29, 2008 in prior U.S. Appl. No. 10/852,249.

Office Action issued on May 12, 2009 in corresponding Japanese patent application No. 2004-212028.

* cited by examiner (a)

(b)

(c)

(d)

(a)

(b)

(c)

(a)

(b)

(c)

LIGHT-EMITTING DEVICE AND METHOD OF MANUFACTURING THE SAME

BACKGROUND OF THE INVENTION

This application claims the priority of Korean Patent Application No. 2003-73442 filed on Oct. 21, 2003, in the Korean Intellectual Property Office, the disclosure of which is incorporated herein in its entirety by reference.

1. Field of the Invention

The present invention relates to a light-emitting device, and more particularly, to a high efficiency light-emitting device with improved light extraction efficiency and good defect density control and stress distribution control and, in which, a substrate limits a surface crystal orientation.

2. Description of the Related Art

In general, light-emitting devices include laser diodes (LD) and light emitting diodes (LED), and LEDs use properties of compound semiconductors to transmit a signal, which is electric energy converted into an infra-red light, visible light, or other forms of light. The converting of electric energy into light can be categorized into temperature radiation and luminescence. Photo luminescence caused by the excitation of light, a cathode luminescence caused by the irradiation of x-ray or an electron beam, and electroluminescence (EL) are all types of luminescence. An LED is one kind of an EL and currently LEDs using group Ill-V compound semiconductors are widely used.

Group III nitride compound semiconductors are direct transition semiconductors, and are widely used in light-emitting devices such as LEDs and LDs since it is possible to obtain stable operation at a high temperature than devices that use other semiconductors. In general, the Group III nitride compound semiconductors use sapphire ($Al_2O_3$) as a substrate and are formed on top of the substrate.

FIG. 1 is a cross-sectional view of in general Group III nitride compound semiconductor, including a sapphire substrate. A n-GaN layer 12, an active layer 13, a p-GaN layer 14, and a p-type electrode layer 15 are sequentially formed on a sapphire substrate 11. In addition, an n-type electrode layer 16 is formed on the n-GaN layer 12 where the active layer 13 is not formed. In a general LED, the most important issue is how efficiently can the light, which is created at an internal active layer, be extracted externally.

To efficiently extract light created in the longitudinal direction of the sapphire substrate and active layer, efforts to form transparent electrodes or reflective layers have been made. However, a large amount of light, which is created at the active layer, is transmitted in a latitudinal direction. Therefore to extract the light in a longitudinal direction, various methods such as forming the side walls of the structure of accumulative layers of a semiconductor device to have a predetermined angle, and forming side walls composed of reflective material have been made, but this caused problems in the manufacturing process and increased costs. Furthermore, to increase the light emitting ability of Group III nitride compound semiconductor light-emitting devices that use a sapphire substrate, a device with a flip chip-type is adopted and the light extraction efficiency is at approximately 40% due to the difference in diffraction rates between the GaN and sapphire substrate.

Recently, as shown in FIG. 2a, an LED structure in which an uneven structure is formed by processing the surface of a sapphire substrate 21 and forming semiconductor crystal layers, which include active layers, on top of the substrate has been introduced. Such a structure forms a diffraction rate interface having an uneven surface under the active layer 22 and enables the external extraction of a portion of the light which fades out within the device.

In addition, when forming a Group III nitride compound semiconductor on the sapphire substrate 21, a dislocation occurs due to the miss fit of the sapphire substrate 21 and the lattice parameters of a Group III nitride compound semiconductor. To prevent this, as shown in FIG. 2b, the sapphire substrate 21 has an uneven surface and a GaN layer 23 is formed on top. FIG. 2c schematically illustrates a process of forming an LED on top of a sapphire substrate which has such an uneven structure. When forming the GaN layer 23 on top of the sapphire substrate 21 which has an uneven structure as shown in FIGS. 2c-(a), GaN facets are grown 24 from the top and each side portion of the uneven structure, as shown in and 2c-(b). Then a planarized GaN layer 23 can be obtained as shown in FIG. 2c-(c). FIG. 2c-(d) illustrates the completion of a light emitting diode, in which an active layer 22, etc. are on top of the planarized GaN layer 23.

This process has a disadvantage in that when growing the semiconductor crystal layer using such a patterned sapphire substrate (PSS), since planarization is carried out after facet growth is performed on the pattern, regrowth has to be done to a sufficient thickness to perform planarization.

In addition, a structure is disclosed (No. WO2001-69663), in which a step difference is formed, group III nitride compound semiconductors are grown on the top surface and side portions of the step difference and a piercing phase is prevented. However, a disadvantage is that a void is formed in the lower portion of the step difference and to planarize the growth layer group III nitride compound semiconductors have to be formed relatively thick.

When regrowing the semiconductor on the sapphire substrate, an ELOG and a PENDEO method are used to reduce the defect density. However, in the case of the ELOG method a separate mask layer is needed, and in the case of the PENDEO method, a void is formed on the interface portion of the substrate resulting in a decrease in light extraction efficiency.

SUMMARY OF THE INVENTION

The present invention provides a light-emitting device and a method of manufacturing the same. The light-emitting device includes a substrate having at least one protruded portion with a curved surface in which a consistent defect density and uniform stress distribution can be obtained even when the growth of the semiconductor crystal layer and the forming of the light-emitting device are completed. In addition, the light-emitting device has a high the light extraction efficiency for extracting light generated at a electroluminescense layer externally.

According to an aspect of the present invention, there is provided a light-emitting device including a substrate having at least one protruded portion with a curved surface, the crystal surface orientations of the at least one protruded portion are different from growth directions of a group III nitride compound semiconductor formed on the at least one protruded portion, and a plurality of semiconductor crystal layers comprising a plurality of active layers and electrodes formed on a portion of the substrate.

In the present invention the curvatures at each point of the surface of the protruded portions is greater than 0.

In the present invention each surface of the protruded portions has a different crystal orientation from a (0001) surface.

In the present invention the substrate is composed of sapphire or material including Si.

In the present invention an n-GaN layer is formed on the substrate, an active layer, a p-GaN layer, and a p-type electrode layer are formed sequentially on a portion of the n-GaN layer, and an n-type electrode layer is formed on a portion of the n-GaN layer where the active layer is not formed.

According to another aspect of the present invention, there is provided a method of manufacturing a light-emitting device includes forming at least one protruded portion with a curved surface on a planarized substrate, and forming semiconductor crystal layers including active layers, on the substrate.

In the present invention, forming the at least one protruded portion includes patterning a photo resist formed on the substrate, hard baking the photo resist and the substrate, and etching the surface of the substrate, thereby forming at least one protruded portion.

In the present invention when etching the substrate surface, an etching gas is a Cl gas selected from the group consisting of $Cl_2$, $BCl_3$, $HCl$, $CCl_4$, and $SiCl_4$.

According to another aspect of the present invention, there is provided a method of manufacturing a light-emitting device including forming at least one protruded portion with a curved surface on a substrate, and growing group III nitride compound semiconductor crystal layers from the substrate surface between the protruded portions until the surface of the protruded portions is covered.

BRIEF DESCRIPTION OF THE DRAWINGS

The above and other features and advantages of the present invention will become more apparent by describing in detail exemplary embodiments thereof with reference to the attached drawings in which:

FIG. 3b is a SEM picture of the surface of the substrate of FIG. 3a;

DETAILED DESCRIPTION OF THE INVENTION

The above and other features and advantages of the present invention will become more apparent by describing in detail exemplary embodiments thereof with reference to the attached drawings.

Figure 2A:
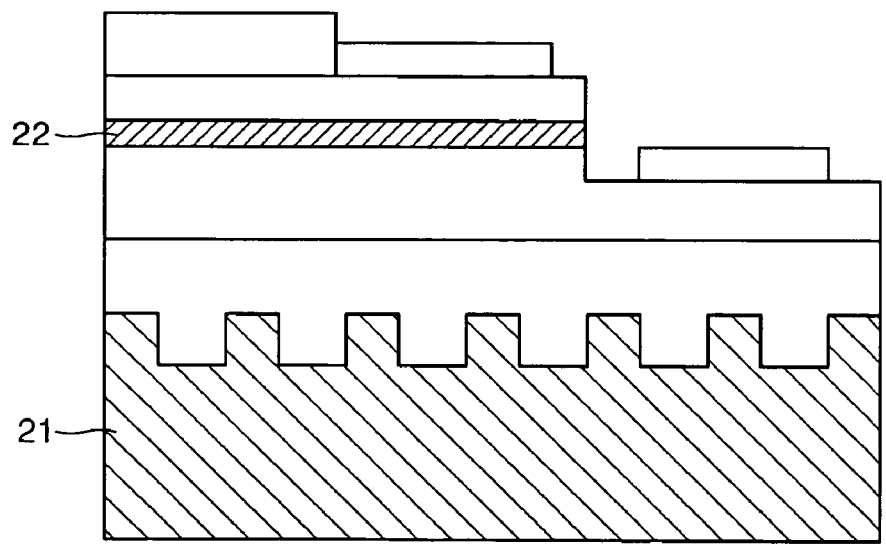
FIGS. 2a and 2b illustrate a general structure and process of forming a Group III nitride compound semiconductor on an eneven sapphire substrate.
Figure 2B:
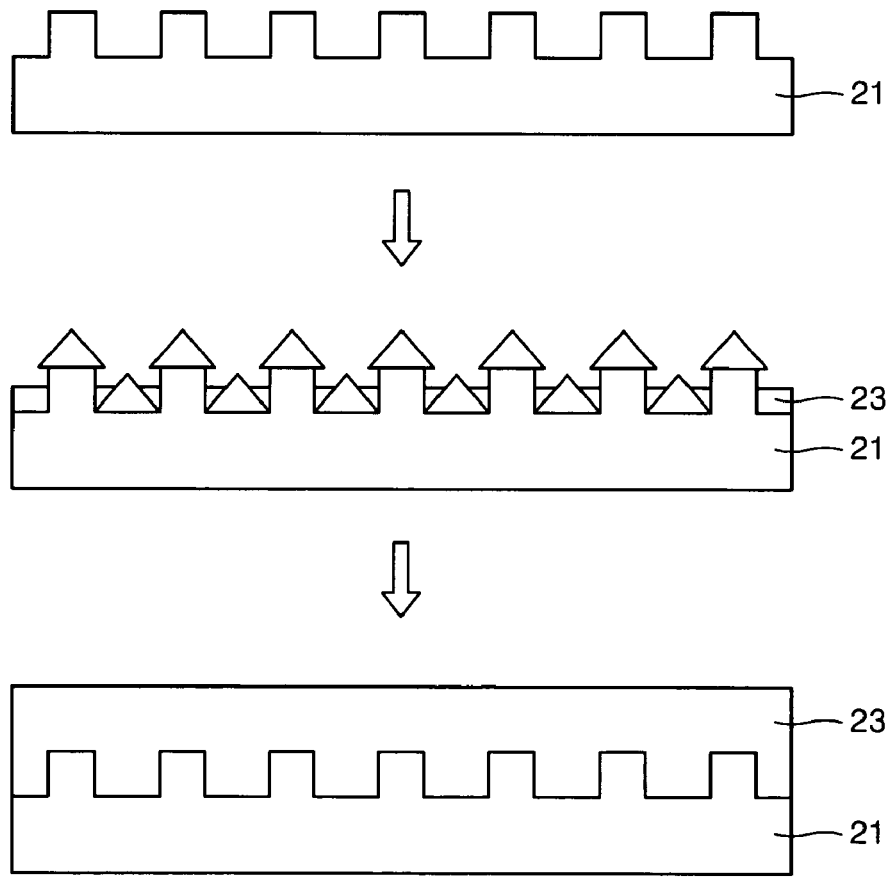
Figure 2C:
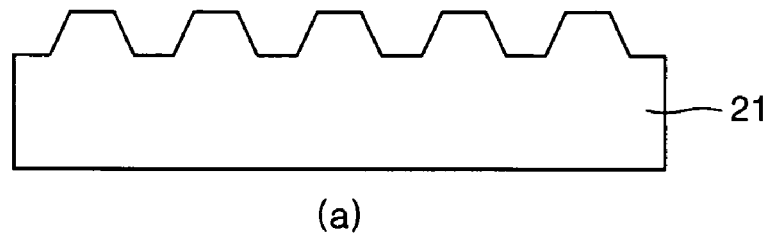
FIG. 2c illustrates a general process of forming an LED on a substrate which has an uneven surface.
Figure 2C:
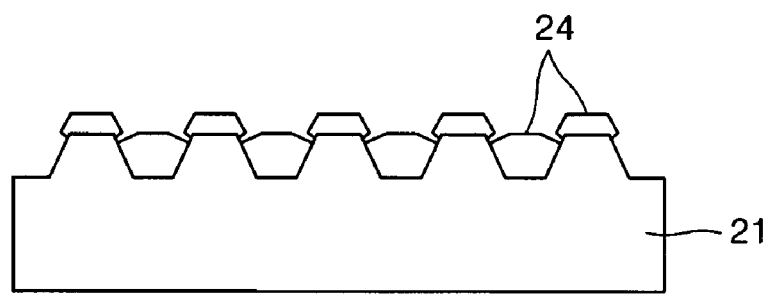
Figure 2C:
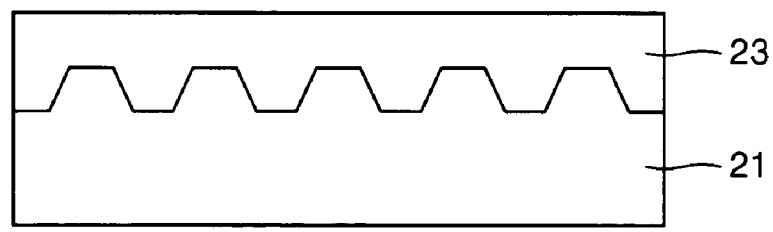
Figure 2C:
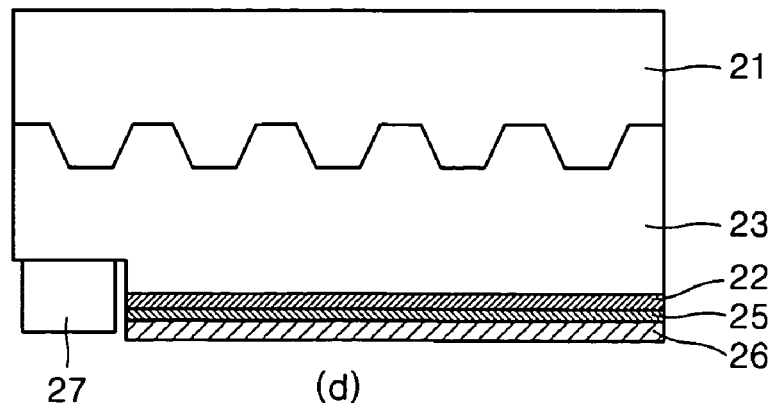
Figure 3A:
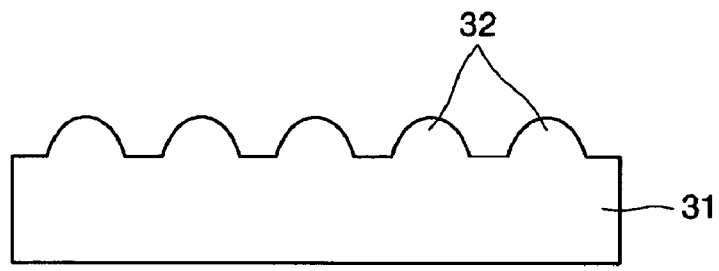
FIG. 3a is a cross-sectional view of a substrate of a light-emitting device according to an embodiment of the present invention.

FIG. 3a is a cross-sectional view of a substrate of a light-emitting device which might include sapphire or Si according to an embodiment of the present invention. As shown in FIG. 3a, smoothly curved protrusions 32 are formed on the surface of a substrate 31. Such protrusions 32 are different from the uneven structure of the general substrate shown in FIGS. 2a through 2c. In other words, the top portion and side portion of the uneven structure of FIGS. 2a through 2c are discriminated since the top portion and side portion are each flat and the side portions are slanted at a predetermined angle with respect to the surface of the substrate 21.

However, the protruded portions 32 formed on the surface of the substrate of FIG. 3a has a curved surface, and thus there is not distinction between the upper portion and side portion, resulting in a surface in which a planarized surface does not exist. Therefore, the curvatures of each portion of the protruded portions 32 are greater than 0. Except where the protruded portion 32 and the main part of the substrate 31 meet, a corner does not exist. Therefore, crystal orientations of the surfaces of the protruded portions 32 of the substrate 31 are different from crystal growth directions (c axis) of the Group III nitride compound semiconductors, which are formed on top of the substrate 31. In other words, the surfaces of the curved surface type protruded portions 32 are formed of a crystal growth surfaces different from a (0001) surface. Therefore, the growth of group III nitride compound semiconductors does not frequently occur on the surface of the protruded portions 32.

Figure 3B:
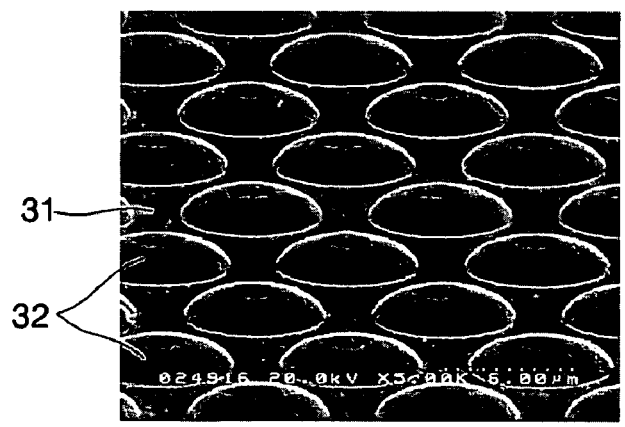

FIG. 3b is a SEM picture of the surface of the substrate 31 of FIG. 3a. The protruded portions 32 use hemispheres. All protruded portions 32 on the surface of the substrate may have identical sizes and forms, but embodiments of the invention are not limited to this, and the size, form and curvature of each portion of the protruded portions 32 may differ slightly. For example, the curvature of the lower portion of the protruded portions 32 may be greater than the curvature of the upper portion or vise versa. In addition, the entire form of the protruded portions 32 may have curved surfaces, be hemispheres, form a striped pattern or have a bent horseshoe shape. Furthermore, there is no limit to the arrangement of the protruded portions so that the protruded portions may have a regular spaced arrangement such as a lattice structure or an irregular spaced arrangement.

The substrate 31 of the light-emitting device according to an embodiment of the present invention is not limited to a sapphire substrate, and any substrate that grows Group III nitride compound semiconductors such as Si, SiC etc. may also be used.

Figure 3C:
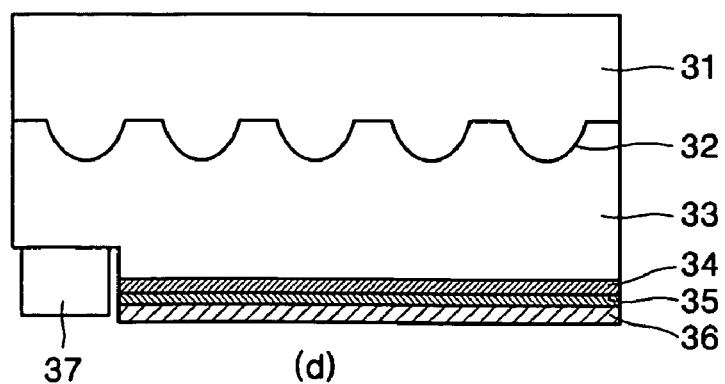
FIG. 3c is a cross-sectional view of a flip chip-type light-emitting device, which includes a substrate in which curved surface type protrusion portions are formed according to the present invention.

FIG. 3c is a cross-sectional view of a flip-chip-type light-emitting device including the substrate 31 according to an embodiment of the present invention. Referring to FIG. 3c, an n-GaN layer 33 is formed on the substrate 31 and an active layer 34, a p-GaN layer 35, and a p-type electrode layer 36 are sequentially formed on a portion of the n-GaN layer 33. In addition, an n-type electrode layer 37 is formed on a portion of the n-GaN layer 33 where the active layer 34 is not formed. The structure of the light emitting device, aside from the substrate 31, is not much different from that of the group IIII nitride compound semiconductor light-emitting device. A group III nitride compound semiconductor formed on the substrate 31 is not limited to GaN, and may also include secondary molecules such as AlN or InN, other tertiary molecules and quadruple molecules.

A method of manufacturing a light-emitting device according to an embodiment of the present invention will be described below. The following is a process of forming a plurality of curved surface type protruded portions on the surface of a substrate.

First, a photo resist on the planarized substrate is patterned. The patterning is carried out using a general photolithography method, and the thickness of the photo resist depends on the target value of the etching depth of the substrate. For example, when the etching depth of the sapphire substrate is approximately 1.2 µm the thickness of the photo resist can be approximately 2 µm.

Next, hard baking is performed at a temperature of approximately 110° C.

In addition, when etching the sapphire substrate, a general reactive ion-etching method is used. Etching gas, pressure, and power are suitably adjusted to form a protruded portion of the substrate. In the present embodiment $Cl_2/BCl_3$ is used as an etching gas, with a pressure of 3 mTorr, and a power of 800 W. For example, the etching gas can be selected from the Cl group of $Cl_2$, $BCl_3$, HCl, $CCl_4$, and $SiCl_4$ etc. Furthermore, the pressure can be between a few mTorr and tens of mTorr, depending on the etching gas, and is preferably 1~40 mTorr.

A plurality of protruded portions can be formed on the substrate surface by the above-described process. Then an n-GaN layer, an active layer, a p-GaN layer, a p-type electrode layer, and n-type electrode layer, are formed on the substrate. In the light-emitting device according to the present embodiment, the compound semiconductor layers formed on the substrate 31 are not largely different from those of general light emitting devices and the manufacturing process can be understand by those skilled in the art. However, when forming the light-emitting device on the substrate surface, with the protruded portions, a separate mask layer is not needed.

Figure 4A:
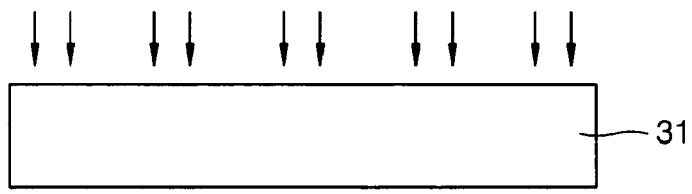
FIGS. 4a through 4d are cross-sectional views illustrating a method of manufacturing a light-emitting device according to an embodiment of the present invention.
Figure 4B:
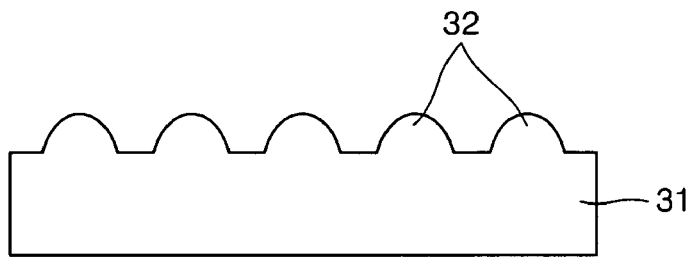
Figure 4C:
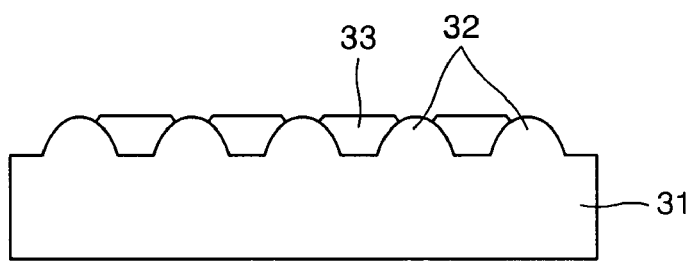
Figure 4D:
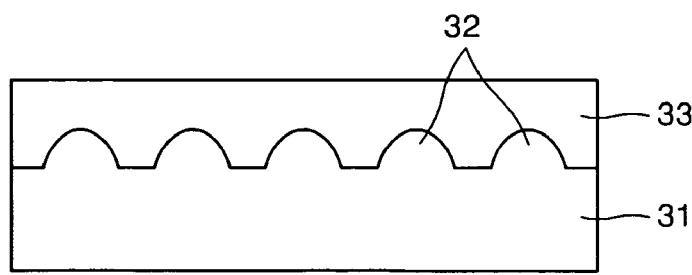

FIGS. 4a through 4d schematically illustrate a method of manufacturing the light-emitting device according to an embodiment of the present invention. Referring to FIGS. 4a and 4b, the surface of the planarized substrate 31 is etched, thereby forming a sapphire substrate 31 which has protruded portions 32 with curved surfaces. Referring to FIG. 4c, the GaN layer 33 is grown on the substrate. Referring to FIG. 4d, the GaN layer 33 is grown to a predetermined thickness and its surface is planarized. FIG. 3c illustrates a completed flip-chip type light-emitting device in which other active layers 34 and electrode layers 36 and 36 are all formed on top of the planarized n-GaN layer 33 of FIG. 4c. A void is not formed at an interface between the substrate 31 and the GaN layer 33. Since the growth process for active layers carried out after the forming of the GaN layers 33 is well described in the prior art, it will not be mentioned here.

The method of manufacturing a light-emitting device illustrated in FIGS. 4a through 4d is different from the method forming a light-emitting device on a substrate that has an uneven surface as shown in FIG. 2c. When obtaining a GaN planarizied layer 32 in a light-emitting device according to an embodiment of the present invention, the GaN does not grow facets as in the prior art and the thickness of the GaN layer 32 for obtaining a planarized layer is relatively thin. In addition, in the prior art, an epitaxial growth occurs, but in the present invention, growth of the GaN layer 33 does not easily occur on the surface of the protruded portion 32.

In the present embodiment, for the crystal growth direction of the Group III nitride compound semiconductor formed on the top of the surface of the protruded portions 32 to have a plurality of crystal orientations, the protruded portions 32 must have curved surfaces. Therefore, the growth of the group III nitride compound semiconductor starts on the surface of the substrate 31 between the protruded portions 32, that is, a planarized portion, and as the thickness of the group III nitride compound semiconductor increases, the side and top portions of the protruded portions 32 become covered.

Figure 5A:
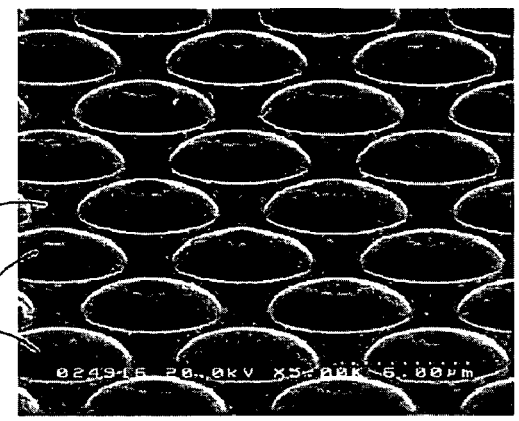
FIG. 5a is a SEM picture illustrating the process of coating a GaN layer on top of the sapphire substrate, which ha a curved surface type protruded portions and planarizing the GaN layer according to the present invention.
Figure 5A:
Figure 5A:
Figure 5B:
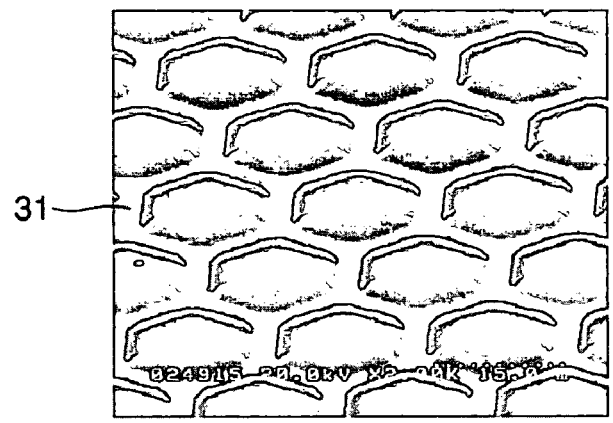
FIG. 5b is a SEM picture illustrating the process of coating and planarizing a GaN layer on top of the sapphire substrate which has an uneven surface that has a planarized top.
Figure 5B:
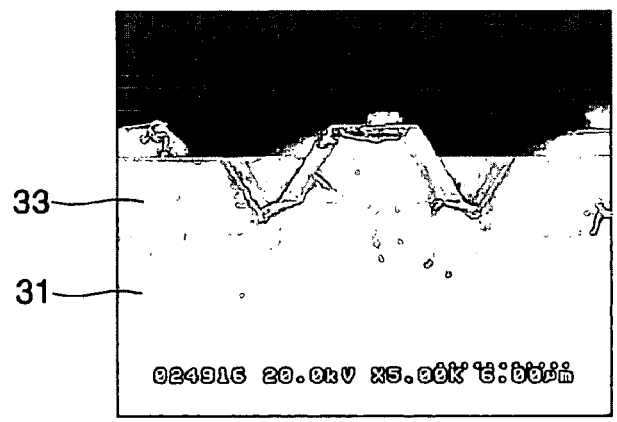
Figure 5B:
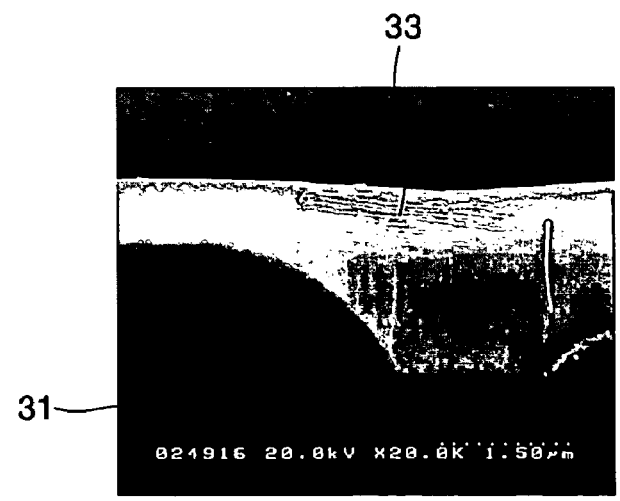

This is confirmed in FIGS. 5a and 5b. FIG. 5a is a SEM image illustrating a process of coating the GaN layer 33 on the substrate 31 with the protruded portions 32 and FIG. 5b is a SEM image illustrating a process of coating the GaN layer 33 on the general substrate 21 with an uneven surface.

The uneven structure, which has a planar surface and protruded portions 32 with curved surfaces formed on the surface of the substrate 31 are manufactured at an identical height. When viewing the SEM images illustrating the GaN layer 33 being formed on the two substrates 31 in identical conditions, it is obvious that there is a difference between the present invention illustrated and the prior art in FIGS. 5a-(b) and 5b-(b).

In other words, in FIG. 5a-(b) the planarization of the substrate 31 is carried out by the GaN layer 33, except on the top portion of the protruded portions 32. On the other hand, in FIG. 5b-(b), facet growth of the GaN occurs on the top and side surfaces of the uneven portion and the degree of planarization is very low. In addition, referring to FIG. 5a-(c), on top of the substrate 31, GaN is coated and complete planarization is achieved. However, referring FIG. 5b-(c), planarization is carried out on top of the uneven surface but complete planarization is not achieved between each uneven surface.

Figure 1:
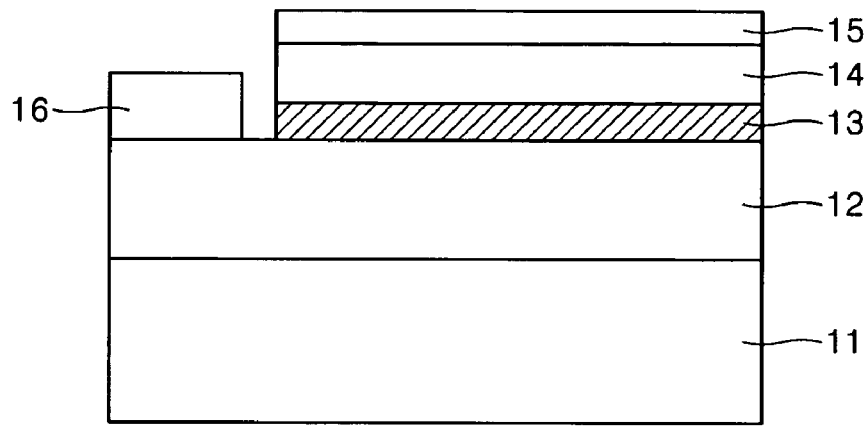
FIG. 1 is a cross-sectional view of a general Group III nitride compound semiconductor using a sapphire substrate.
Figure 6:
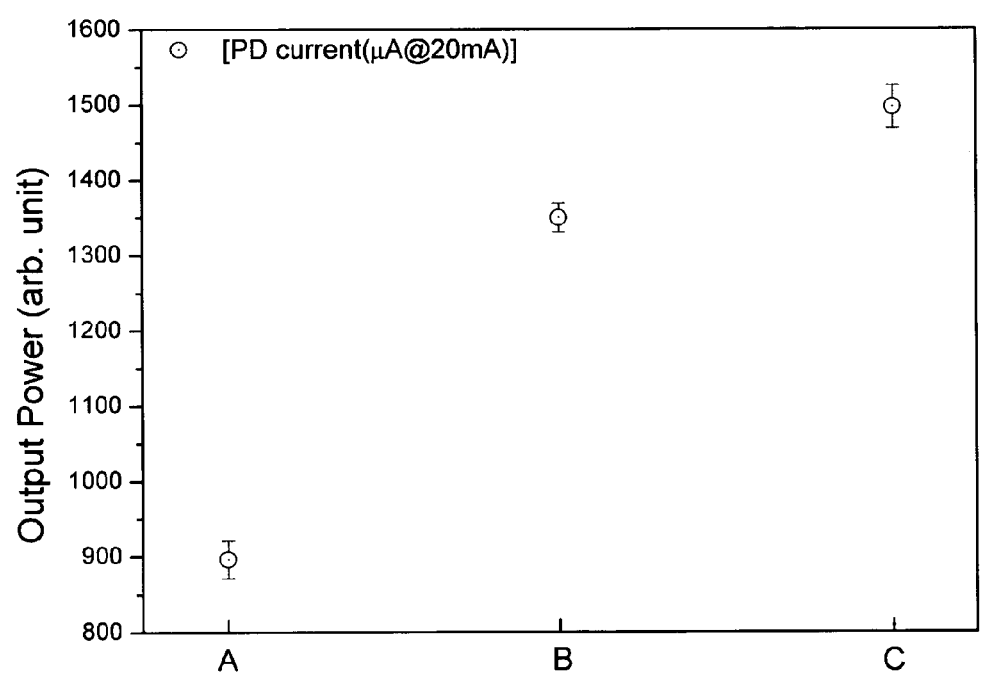
FIG. 6 is a diagram to compare the light extraction power of the light-emitting device according the present invention with that of prior art.

FIG. 6 is a graph comparing the light extraction of the light-emitting device according to the present invention with that of prior art. A illustrates the light-emitting device which is formed on the general planarized substrate 11 shown in FIG. 1. B illustrates the light-emitting device formed on the general substrate 21 having the uneven surface shown in FIG. 2d. C illustrates a light-emitting device, formed on the substrate 31 having protruded portions 32 with curved surfaces according to the present invention, shown in FIG. 3c.

Referring to FIG. 6, the light extraction in case B in which the light-emitting device is formed on the substrate 21 with an uneven surface is 50% greater than the case of A in which the light-emitting device is formed on the substrate 11 with the planar surface. The light extraction in case C in which the light-emitting device is formed on the substrate 31, with the protruded portions 32, with the curved surfaces is greater than 60% more than in case A. In addition, light extraction in case C is approximately 10% than in case B. This is because in the substrate 31 with the protruded portions 32, the semiconductor crystal layer forms an optical lens which changes the light path and reduces the defect density of the growing semiconductor crystal layer.

While the present invention has been particularly shown and described with reference to exemplary embodiments thereof, it will be understood by those of ordinary skill in the art that various changes in form and details may be made therein without departing from the spirit and scope of the present invention as defined by the following claims. For example, the protruded portions of the light-emitting device according to embodiments of the present invention are different from the crystal growth directions of the Group III nitride compound semiconductor to be formed on the substrate, and may be hemispheres, stripes, horse shoe shapes etc., and the arrangement can include regular and irregular arrangements.

According to embodiments of the present invention, when forming a light-emitting device which includes an electroluminescence layer on top of a substrate having protruded portions with curved surfaces, planarization is carried out efficiently and consistent defect density control and control of stress distribution is easily attained, even when the growth and light-emitting device of the semiconductor crystal layer are complete, and, as a result, can increase light extraction efficiency of the light which is generated at the electroluminescence layer are directed toward the outside of the light-emitting device.

What is claimed is:

1. A method of manufacturing a light-emitting device, comprising:

forming at least one protruded portion with a curved surface on a planarized substrate; and forming a first semiconductor crystal layer on the substrate to cover the surface of the protruded portions and planarizing said first semiconductor crystal layer; and sequentially forming an active layer and a second semiconductor crystal layer on the first semiconductor crystal layer, wherein the crystal surface orientations of the at least one protruded portion except the vertex thereof are different from growth directions of the semiconductor crystal layers; and the step of forming the first semiconductor crystal layer is performed so that a first growth rate of the first semiconductor crystal layer on the substrate surface between the protruded portions is higher than a second growth rate of the first semiconductor crystal layer on the surface of the protruded portions such that the majority of the growth of the first semiconductor crystal layer occurs on the substrate surface between the protruded portions.

2. The method of claim 1 further comprising, before the forming the at least one protruded portion:

patterning a photo resist formed on the substrate;

hard baking the photo resist and the substrate; and etching the surface of the substrate, thereby forming at least one protruded portion.

3. The method of claim 2, wherein, when etching the substrate surface, an etching gas is a Cl gas selected from the group consisting of $Cl_2$, $BCl_3$, HCl, $CCl_4$, and $SiCl_4$.

4. A method of manufacturing a light-emitting device, comprising:

forming a plurality of protruded portions with curved surfaces on a substrate;

growing a first group III nitride compound semiconductor crystal layer from the substrate surface between the protruded portions until the surface of the protruded portions is covered and the first group III nitride compound semiconductor crystal layer has a planar upper surface; and sequentially growing an active layer and a second group III nitride compound semiconductor crystal layer on the first group III nitride compound semiconductor crystal layer, wherein the crystal surface orientations of the at least one protruded portion except the vertex thereof are different from growth directions of a group III nitride compound semiconductor formed on the at least one protruded portion; and the step of forming the first group III nitride compound semiconductor crystal layer is performed so that a first growth rate of the first group III nitride compound semiconductor crystal layer on the substrate surface between the protruded portions is higher than a second growth rate of the first group III nitride compound semiconductor crystal layer on the surface of the protruded portions such that the majority of the growth of the first group III nitride compound semiconductor crystal layer occurs on the substrate surface between the protruded portions.

5. The method of claim 4, wherein each surface of the protruded portions has a different crystal direction from that of a (0001) surface.

6. The method of claim 4, wherein the steps of growing are performing by epitaxial growing.

7. A method of manufacturing a light-emitting device comprising:

forming a plurality of protruded portions with a curved surface on a substrate;

growing a first group III nitride compound semiconductor crystal layer from the planar surface between the protruded portions until the curved surface of the protruded portions is covered and the first group III nitride compound semiconductor crystal layer has a planar upper surface; and sequentially growing an active layer and a second group III nitride compound semiconductor crystal layer on the first group III nitride compound semiconductor crystal layer;

wherein the crystal surface orientations of the at least one protruded portion except the vertex thereof are different from growth directions of a group III nitride compound semiconductor formed on the at least one protruded portion; and the step of growing the first group III nitride compound semiconductor crystal layer comprises the step of growing the first group III nitride compound semiconductor crystal layer on the substrate surface between the protruded portions without a facet growth on the curved surface of the protruded portions.

8. A method of manufacturing a light-emitting device comprising:

forming at least one protruded portion with a curved surface surrounded by a planar surface on a planarized substrate;

forming a first semiconductor crystal layer on the substrate to cover the curved surface of the protruded portions and planarizing said first semiconductor crystal layer; and wherein the crystal surface orientations of the at least one protruded portion except the vertex thereof are different from growth directions of the semiconductor crystal layers; and the step of forming the first semiconductor crystal layer comprises the step of growing the first semiconductor crystal layer on the substrate surface between the protruded portions covered without a facet growth on the curved surface of the protruded portions.

9. A method of manufacturing a light-emitting device comprising:

forming at least one protruded portion with a curved surface surrounded by a planar surface on a planarized substrate;

forming a first semiconductor crystal layer on the substrate to cover the curved surface of the protruded portions and planarizing said first semiconductor crystal layer; and sequentially forming an active layer and a second semiconductor crystal layer on the first semiconductor crystal layer, wherein the crystal surface orientations of the at least one protruded portion except the vertex thereof are different from growth directions of the semiconductor crystal layers; and the step of forming the first semiconductor crystal layer is performed so that a first growth rate of the first semiconductor crystal layer on the substrate surface between the protruded portions is constantly higher than a second growth rate of the first semiconductor crystal layer on the surface of the protruded portions.

10. A method of manufacturing a light-emitting device comprising:
   forming a plurality of protruded portions with curved surfaces on a substrate;
   growing a first group III nitride compound semiconductor crystal layer from the planar surface between the protruded portions until the curved surface of the protruded portions is covered and the first group III nitride compound semiconductor crystal layer has a planar upper surface; and
   sequentially growing an active layer and a second group III nitride compound semiconductor crystal layer on the first group III nitride compound semiconductor crystal layer,
   wherein the crystal surface orientations of the at least one protruded portion except the vertex thereof are different from growth directions of a group III nitride compound semiconductor formed on the at least one protruded portion; and
   the step of forming the first group III nitride compound semiconductor crystal layer is performed so that a first growth rate of the first group III nitride compound semiconductor crystal layer on the substrate surface between the protruded portions is constantly higher than a second growth rate of the first group III nitride compound semiconductor crystal layer on the surface of the protruded portions.

11. A method of manufacturing a light-emitting device comprising:
   forming at least one protruded portion with a curved surface surrounded by a planar surface on a planarized substrate;
   forming a first semiconductor crystal layer on the substrate to cover the curved surface of the protruded portions and planarizing said first semiconductor crystal layer; and
   sequentially forming an active layer and a second semiconductor crystal layer on the first semiconductor crystal layer,
   wherein the crystal surface orientations of the at least one protruded portion except the vertex thereof are different from growth directions of the semiconductor crystal layers; and
   the step of forming the first semiconductor crystal layer is performed so that a first growth rate of the first semiconductor crystal layer on the substrate surface between the protruded portions is higher than a second growth rate of the first semiconductor crystal layer on the entire surface of the protruded portions.

12. A method of manufacturing a light-emitting device comprising:
   forming a plurality of protruded portions with curved surfaces on a substrate;
   growing a first group III nitride compound semiconductor crystal layer from the planar surface between the protruded portions until the curved surface of the protruded portions is covered and the first group III nitride compound semiconductor crystal layer has a planar upper surface; and
   sequentially growing an active layer and a second group III nitride compound semiconductor crystal layer on the first group III nitride compound semiconductor crystal layer,
   wherein the crystal surface orientations of the at least one protruded portion except the vertex thereof are different from growth directions of a group III nitride compound semiconductor formed on the at least one protruded portion; and
   the step of forming the first group III nitride compound semiconductor crystal layer is performed so that a first growth rate of the first group III nitride compound semiconductor crystal layer on the substrate surface between the protruded portions is higher than a second growth rate of the first group III nitride compound semiconductor crystal layer on the entire surface of the protruded portions.

* * * * *